United States Patent [19]
Guldi

[11] Patent Number: 5,576,230
[45] Date of Patent: Nov. 19, 1996

[54] METHOD OF FABRICATION OF A SEMICONDUCTOR DEVICE HAVING A TAPERED IMPLANTED REGION

[75] Inventor: Richard L. Guldi, Dallas, Tex.

[73] Assignee: Texas Instruments Incorporated, Dallas, Tex.

[21] Appl. No.: 300,301

[22] Filed: Sep. 2, 1994

[51] Int. Cl.⁶ ................................................. H01L 21/265
[52] U.S. Cl. ............................ 437/41; 437/44; 437/924; 437/984; 437/28; 437/29
[58] Field of Search ................................. 437/41, 44, 69, 437/70, 924, 984, 28, 29, 931; 148/DIG. 102

[56] References Cited

U.S. PATENT DOCUMENTS

| | | | |
|---|---|---|---|
| 4,755,479 | 7/1988 | Miura | 437/44 |
| 5,096,841 | 3/1992 | Miura et al. | 437/29 |
| 5,102,815 | 4/1992 | Sanchez | 437/44 |
| 5,384,270 | 1/1995 | Ueno | 437/984 |
| 5,428,240 | 6/1995 | Luv | 437/28 |
| 5,482,876 | 1/1996 | Hsieh et al. | 437/44 |

FOREIGN PATENT DOCUMENTS 61-084016  4/1986  Japan.
2-122669  5/1990  Japan.

OTHER PUBLICATIONS

A. C. Ajmera et al., "Elimination of end-of-range and mask edge lateral damage in Ge+ preamorphized, B+ implanted Si," *Appl. Phys. Lett.*, vol. 49, No. 19, Nov. 10, 1986.

*Primary Examiner*—George Fourson
*Assistant Examiner*—Thomas G. Bilodeau
*Attorney, Agent, or Firm*—W. James Brady, III; Richard L. Donaldson

[57] ABSTRACT

A semiconductor device includes implanted regions (54) formed in a semiconductor layer (12). The implanted regions (54) are self-aligned with field oxide regions (20) and a gate structure (25) and have side edges (56, 57) that are formed at an angle with respect to the (001) plane and bottom edges (58) that are aligned with the (110) plane. Since side edges (56, 57) and not aligned with the (001) plane, when an anneal is performed, recrystallization proceeds primarily from the (110) plane alone rather than from the (110) and (001) planes simultaneously. Accordingly, the edge recrystalline damage caused by the intersecting of recrystallized silicon growing along the (110) and (001) planes simultaneously is avoided.

15 Claims, 15 Drawing Sheets

METHOD OF FABRICATION OF A SEMICONDUCTOR DEVICE HAVING A TAPERED IMPLANTED REGION

FIELD OF THE INVENTION

This invention relates generally to semiconductor devices and, more particularly, to a semiconductor device having a tapered implanted region and a method of fabrication thereof.

BACKGROUND OF THE INVENTION

A problem in the manufacture of silicon integrated circuits is the formation of certain defects, commonly referred to as dislocations. There are various types of dislocations, but in general, all manifestations are some form of distortion of the crystalline lattice. Dislocations have undesired effects on device yield and reliability because they can provide conductive paths that short out electrical signals.

One source of dislocations arises when crystalline silicon is implanted with a high dose implant that creates structural damage in the crystalline silicon, in many cases making the surface region of the silicon amorphous. During subsequent anneal to electrically activate the implanted region, the damaged region undergoes recrystallization. The recrystallization rate depends on crystallographic direction and proceeds fastest for the (110) and (001) planes. These planes are often aligned along the edges of an implanted region in typical integrated circuit layouts.

As recrystallization proceeds, beginning first at the boundaries between amorphous and recrystallized silicon at the bottom and sides of the implanted region, an area along the intersection of the fast growing (110) and (001) planes undergoes imperfect recrystallization, leaving residual damage in the form of microscopic dislocations. These microscopic dislocations can propagate into longer dislocations, traversing distances on the order of microns, under the application of stress from overlayers or by subsequent processing. Extended dislocations that become electrically active provide a path for undesirable leakage currents that can render a circuit defective.

A prior technique for reducing extended dislocations in germanium implanted regions in a layer of semiconductor material is described in the article "Elimination of end-of-range and mask edge lateral damage in Ge+ preamorphized, B+ implanted Si" by A. C. Ajmera and G. A. Rozgonqi, Appl. Phys. Lett., Vol. 49, No. 19, Nov. 10, 1986, pages 1269–1271. This technique includes forming a layer of oxide over the layer of semiconductor material, photolithographically masking the layer of oxide to define a window region, and performing a wet etch to produce a tapered window in the oxide layer. Subsequent implantation of an impurity through the tapered oxide window produces an implanted region having tapered side edges which result in a reduction in extended dislocations. A drawback to this technique is that it is not compatible with the formation of implanted regions that are self-aligned with gate structures or field oxide regions.

SUMMARY OF THE INVENTION

A need therefore exists for a method of reducing extended dislocations in self-aligned implanted regions.

In one aspect of the invention, a method for forming an implanted region in a semiconductor layer includes forming a surface extending upwardly from a face of the semiconductor layer to define a corner adjacent the face; forming a fillet adjacent the corner, the fillet having a first surface adjacent the face, a second surface adjacent the surface extending upwardly from the face, and a third side extending from an edge of the second side to an edge of the first side; and implanting an impurity through the fillet into the semiconductor layer to form an implanted region having a side edge, the side edge sloped at an angle with respect to a plane perpendicular to face.

In another aspect of the invention, a semiconductor device includes a semiconductor layer; a surface of a field oxide region or a gate region extending upwardly from a face of the semiconductor layer to define a corner adjacent the face; and an implanted region formed at the face, the implanted region self-aligned with the surface extending upwardly from the face and having a side edge sloped at an angle with respect to a plane perpendicular to the face.

An advantage of the invention is that since the side edge of the implanted region is sloped at an angle with respect to a plane perpendicular to the face it is not aligned with the (001) plane. As a result, when the anneal is performed, recrystallization proceeds primarily from the (110) plane alone rather than from the (110) and (001) planes simultaneously. Accordingly, the edge recrystalline damage caused by the intersecting of recrystallized silicon growing along the (110) and (001) planes simultaneously is avoided.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
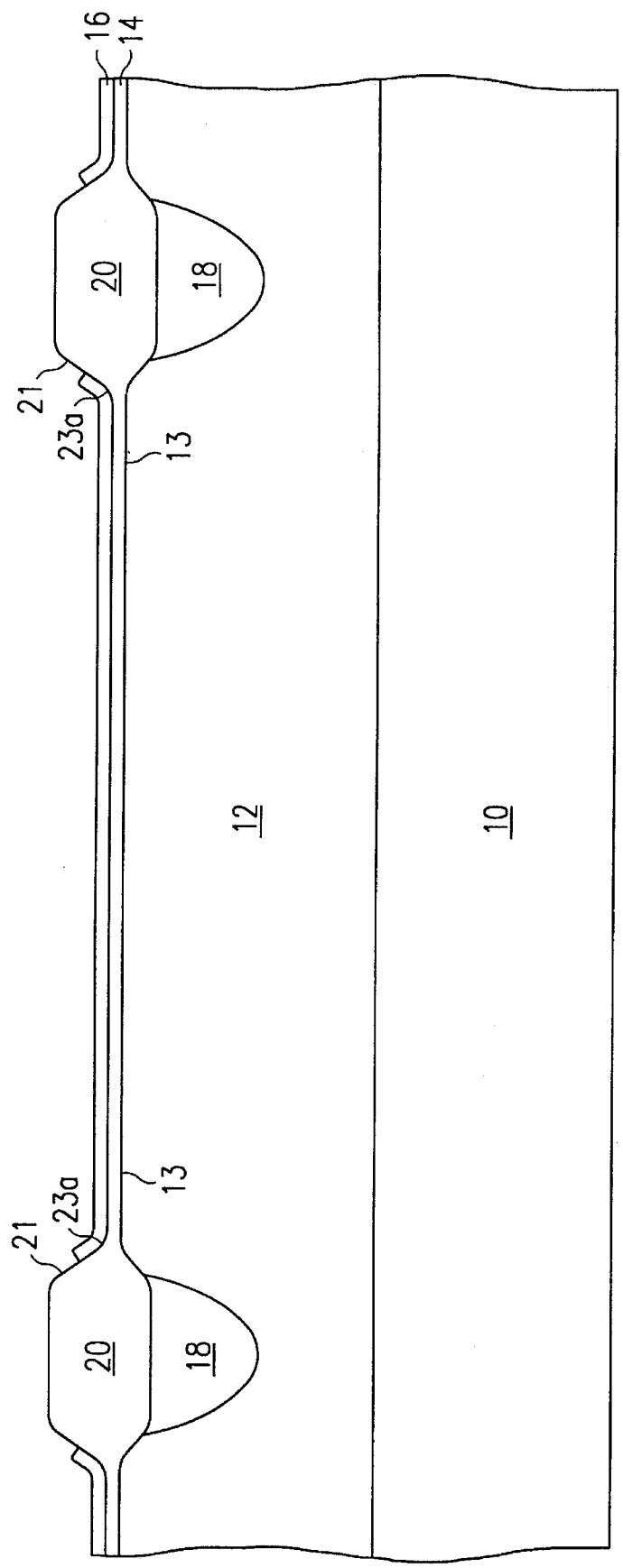
FIGS. 1–5 are cross-sectional elevation views of a field effect transistor at successive stages during fabrication according to the prior art.

Successive stages in a method of fabricating a field effect transistor according to the prior art are shown in cross-sectional elevation views in FIGS. 1–5. As seen in FIG. 1, a layer 12 of p- type epitaxial silicon having a thickness of 0.5–20 microns is initially formed on a p type silicon substrate 10. A pad oxide layer 14 is grown or deposited on the face 13 of layer 12 to a depth of about 40 nanometers. A silicon nitride layer 16 having a thickness of 50–150 nanometers is then deposited over layer 14 using low pressure chemical vapor deposition.

Layers 14 and 16 are then patterned with photoresist and a plasma etch performed to define the active region in layer 12 in which the field effect transistor will be formed. As a result of the patterning and etching, oxide layer 14 and nitride layer 16 remain over the active region in epitaxial layer 12 while nitride layer 16 is removed from the areas in epitaxial layer 12 where isolating thick field oxide will subsequently be formed.

A boron implant is then performed to create p- channel stop regions 18. The photoresist is then removed and thick field oxide regions 20 are thermally grown to a thickness of about 300–1000 nanometers resulting in the structure of FIG. 1. Field oxide regions 20 have side surfaces 21 that extend upwardly from face 13 of epitaxial layer 12 to define corners 23a adjacent face 13. Corners 23a are located at the interface of side surface 21 and face 13. The remaining portions of oxide layer 14 and nitride layer 16 are then removed by etching to expose the face of epitaxial layer 12.

Figure 2:
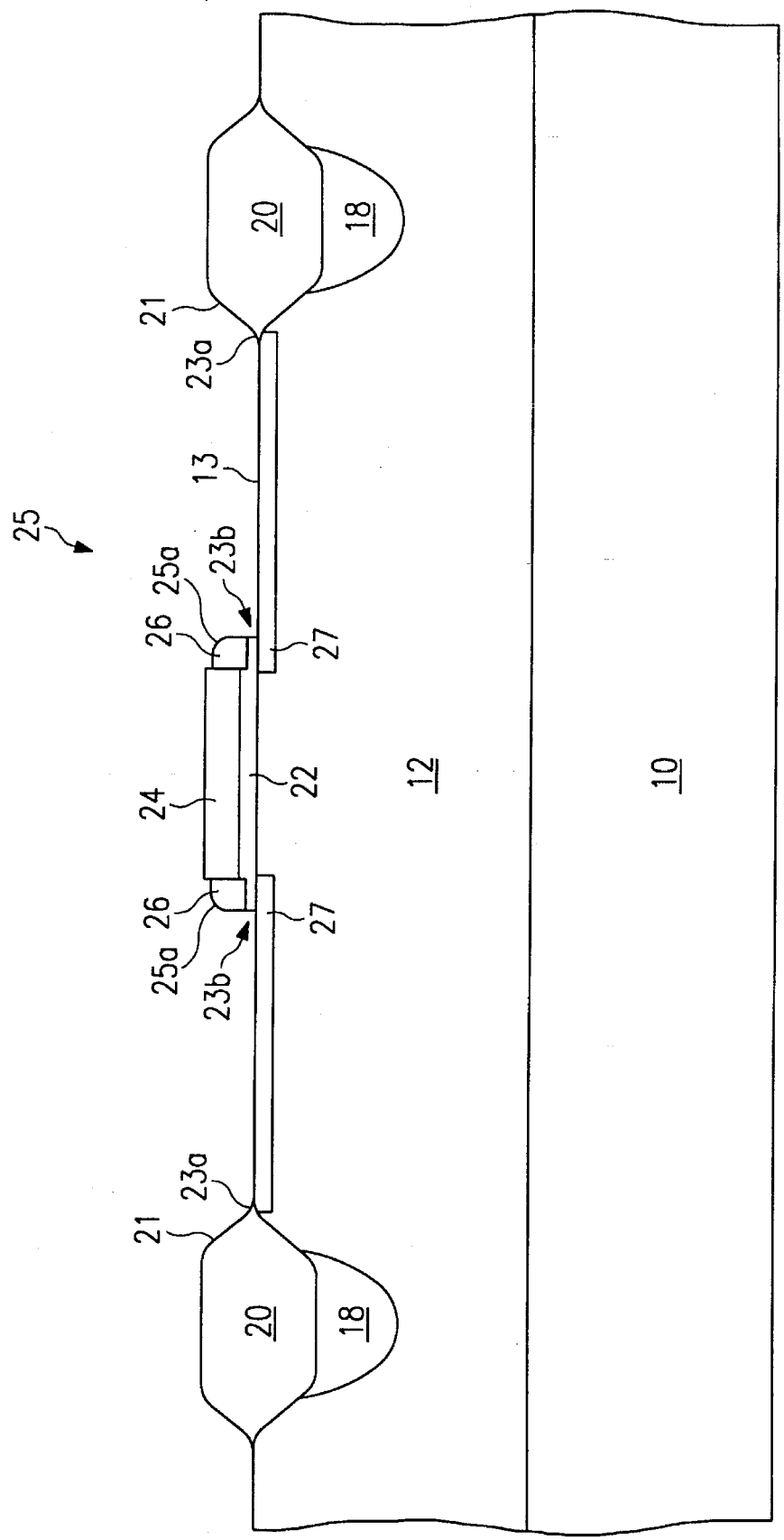

A gate oxide layer 22 is then thermally grown over the face of epitaxial layer 12 between field oxide regions 20 to a thickness of about 6–40 nanometers. A layer of polysilicon having a thickness of 100–500 nanometers is then deposited over epitaxial layer 12 and doped with an impurity to render it conductive. The layer of polysilicon is then patterned with photoresist. A plasma etch removes the unprotected portion of the polysilicon layer to define conductive gate 24. An implant of a donor impurity, such as arsenic, phosphorous, or antimony, is then performed to create n- source/drain reach-through regions 27. Source/drain reach-through regions 27 are self-aligned with field oxide regions 20 and gate 24. An insulator layer, of oxide or nitride, for example, is then deposited over epitaxial layer 12 and anisotropically etched to form sidewall spacers 26. This etch also removes a portion of gate oxide layer 22 to expose the face of epitaxial layer 12 between field oxide regions 20 and sidewall spacers 26. This results in gate structure 25 that includes gate 24, gate oxide layer 22, and sidewall spacers 26 as seen in FIG. 2. Gate structure 25 has side surfaces 25a that extend upwardly from face 13 of epitaxial layer 12 to define corners 23b adjacent face 13. Corners 23b are located at the interface of side surfaces 25a of gate structure 25 and face 13.

Figure 3:
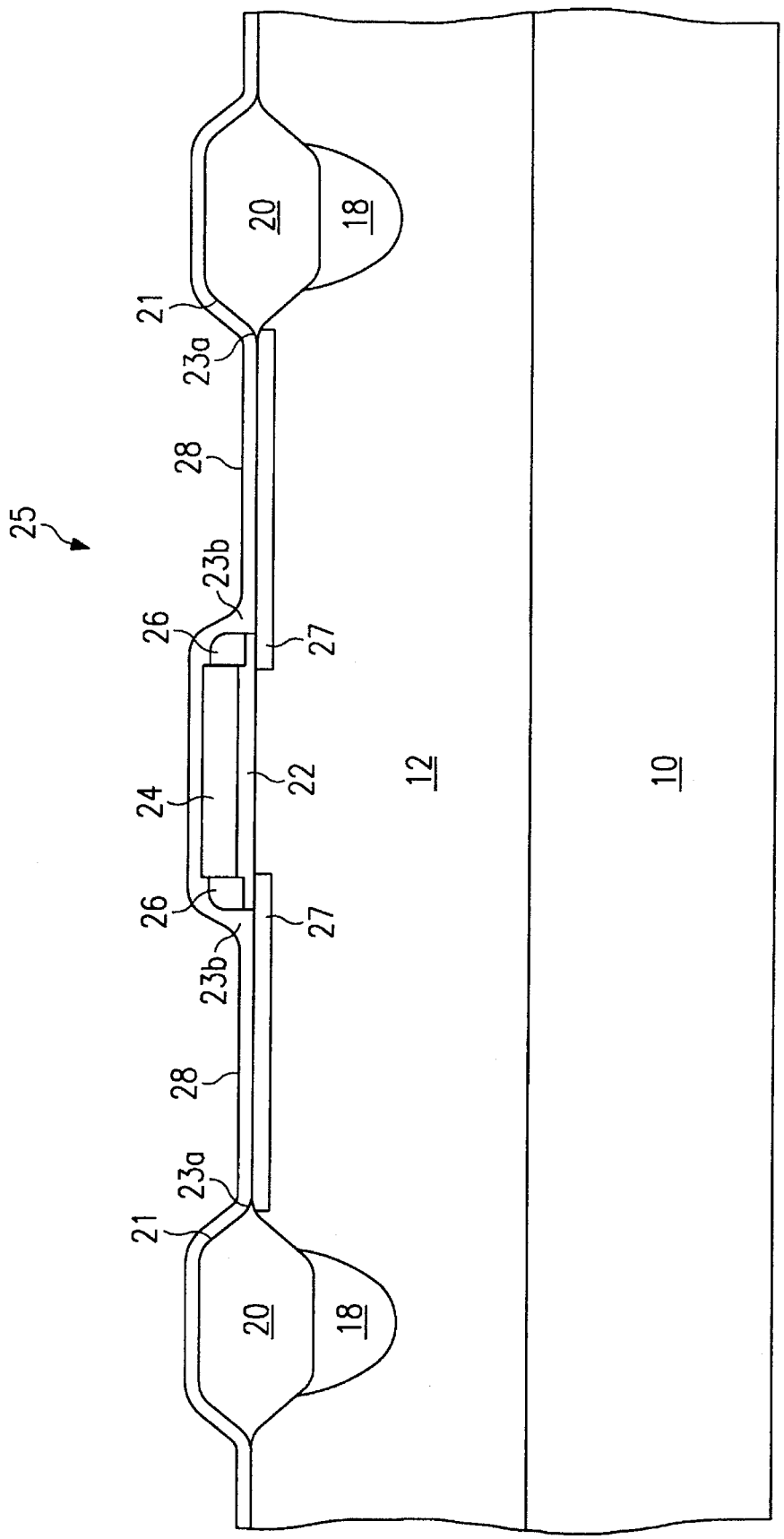

As seen in FIG. 3, a screen layer 28 formed of oxide, nitride, or oxy-nitride, for example, and having a thickness of about 20–40 nanometers is then deposited or grown over epitaxial layer 12. Screen layer 28 prevents undesirable species, such as metal impurities, from reaching epitaxial layer 12 during source/drain implantation. The undesirable species have a lower energy than the species to be implanted during source/drain implantation and do not penetrate through screen layer 28.

Figure 4:
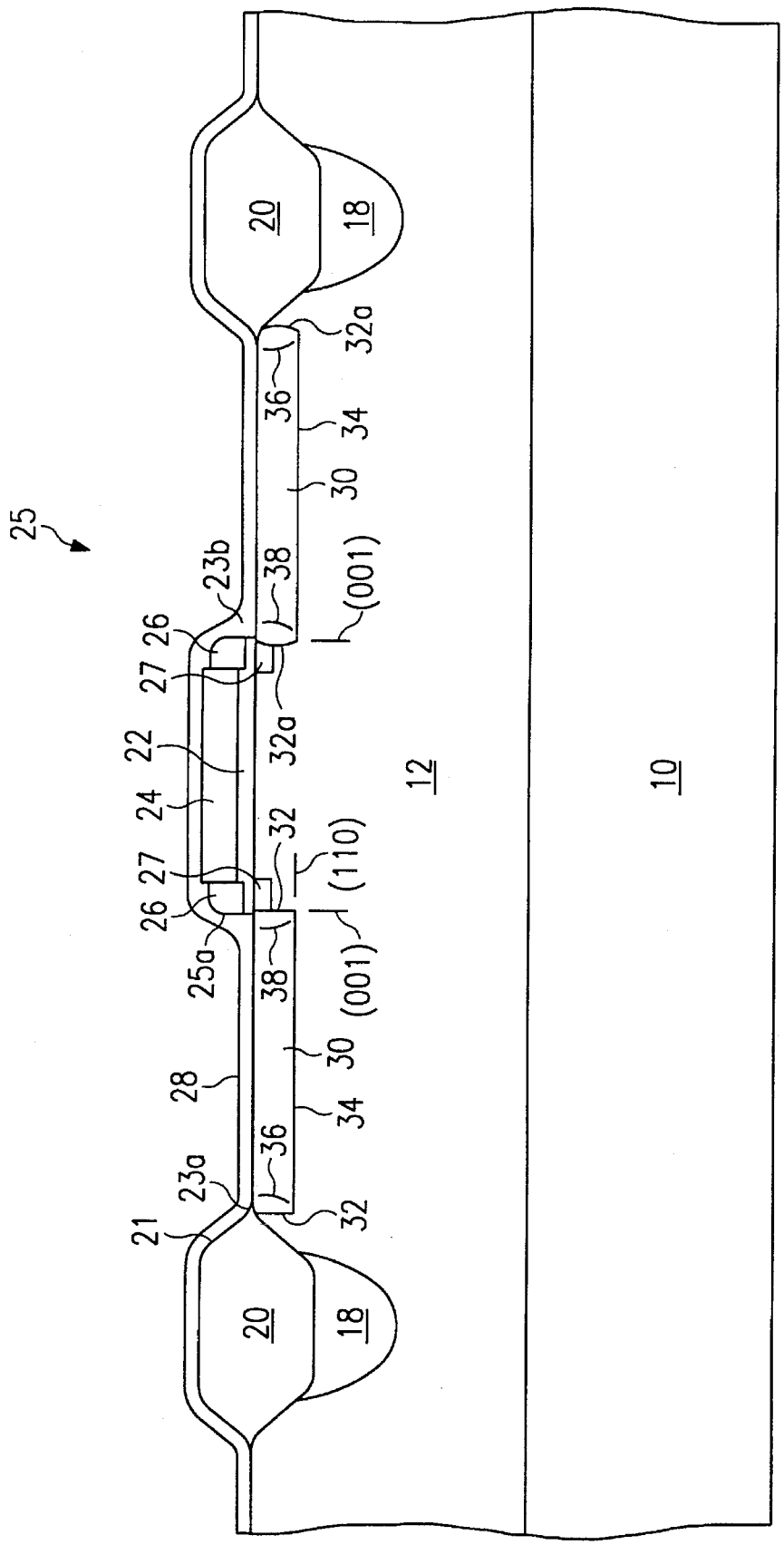

As seen in FIG. 4, a source/drain implant of a donor impurity, such as arsenic, phosphorous, or antimony, is then performed using gate structure 25 and thick field oxide regions 20 as a mask to create implanted n+ source/drain regions 30. Each of source/drain regions 30 is thus self-aligned with a side surface 25a of gate structure 25 and a side surface 21 of one of field oxide regions 20. Source/drain regions 30 may have side edges that are substantially vertical, such as side edges 32, or side edges that have a slight outward bulge, such as side edges 32a. Each of side edges 32 and 32a, however, is substantially aligned with the (001) plane. This source/drain implantation heavily damages the silicon in source/drain regions 30 and in many cases causes the silicon to be amorphized.

An anneal is subsequently performed in either a furnace tube or in a single wafer rapid thermal annealer to electrically activate the source/drain impurity. During the anneal, the silicon damaged by implantation undergoes recrystallization. The recrystallization rate depends on crystallographic direction and proceeds fastest for (110) and (001) planes. These planes are often aligned along the edges of an implanted region for typical integrated circuit layouts. FIG. 4 shows the (001) and (110) planes aligned with side edges 32, 32a and bottom edges 34, respectively, of implanted source/drain regions 30.

As recrystallization proceeds, beginning first at the boundaries between amorphous and recrystallized silicon at the bottom edges 34 and sides edges 32, 32a of implanted regions 30, an area along the intersection of the fast growing (110) and (001) planes undergoes imperfect recrystallization. As a result of the imperfect recrystallization, residual damage in the form of dislocations 36 adjacent field oxide regions 20 and dislocations 38 adjacent gate 24 can occur. Dislocations 36 and 38 may propagate into extended dislocations as a result of the application of stress from overlayers or by subsequent processing.

Figure 5:
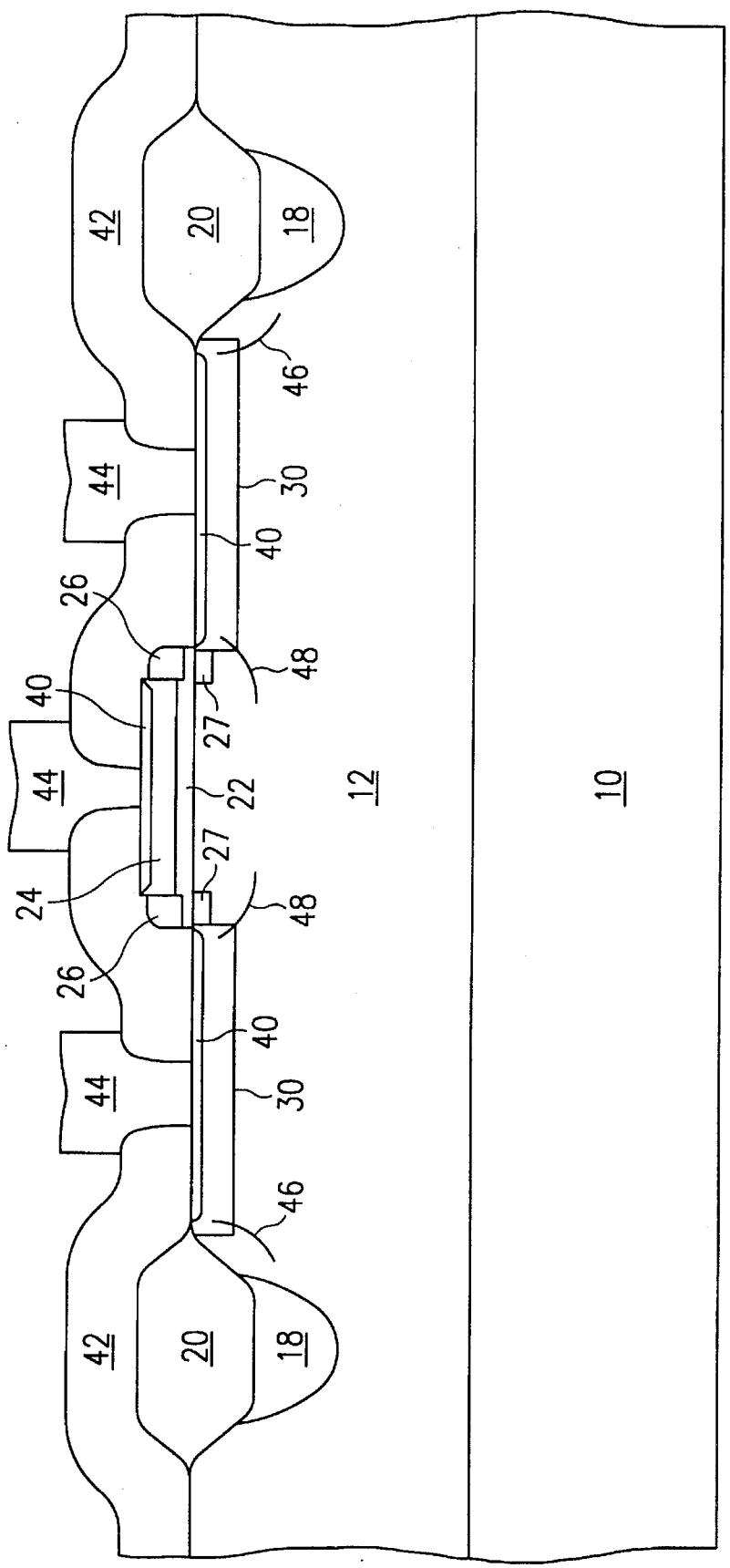

After source/drain anneal, screen layer 28 may be left intact to become part of the final device structure or it may be removed by an etch prior to the formation of silicide layers 40 over source/drain regions 30 and gate 24 as shown in FIG. 5. Silicide layers 40 are formed by depositing a thin film of material such as Ti or Co, on the surface of epitaxial layer 12 and gate 24 and reacting that material to form silicide layers 40 over source/drain regions 30 and gate 24.

A poly-metal dielectric (PMD) layer 42 is then deposited on layer 2, as shown in FIG. 5. Contact openings are then etched in PMD layer 42 to expose portions of silicide layers 40. A metal layer is then deposited over PMD layer 42 and patterned and etched to form contacts 44 contacting silicide layers 30. Fabrication of PMD layer 42 involves high stress and high temperature and is an example of a processing step that can cause incipient damage areas, such as dislocations 36 and 38, to propagate into extended dislocations. Conventionally, PMD layer 42 is formed by low pressure chemical vapor deposition (LPCVD) at temperatures as high as 700 degrees Centigrade. The fabrication of PMD layer 42 by conventional LPCVD techniques produces high stress in epitaxial layer 12 especially at gate edges and field oxide edges. The high stress at gate and field oxide edges can cause dislocations 36 and 38 to propagate into extended dislocations 46 and 48 as shown in FIG. 5. Extended dislocations 46 and 48 may traverse distances as long as several microns.

Extended dislocations 46 and 48 may become electrically active to provide a path for undesirable leakage currents that can render a circuit defective. Extended dislocations that become electrically active during manufacturing and testing are therefore a cause of yield loss. Extended dislocations that become electrically active in use subsequent to testing cause concern with regard to device reliability.

Figure 6:
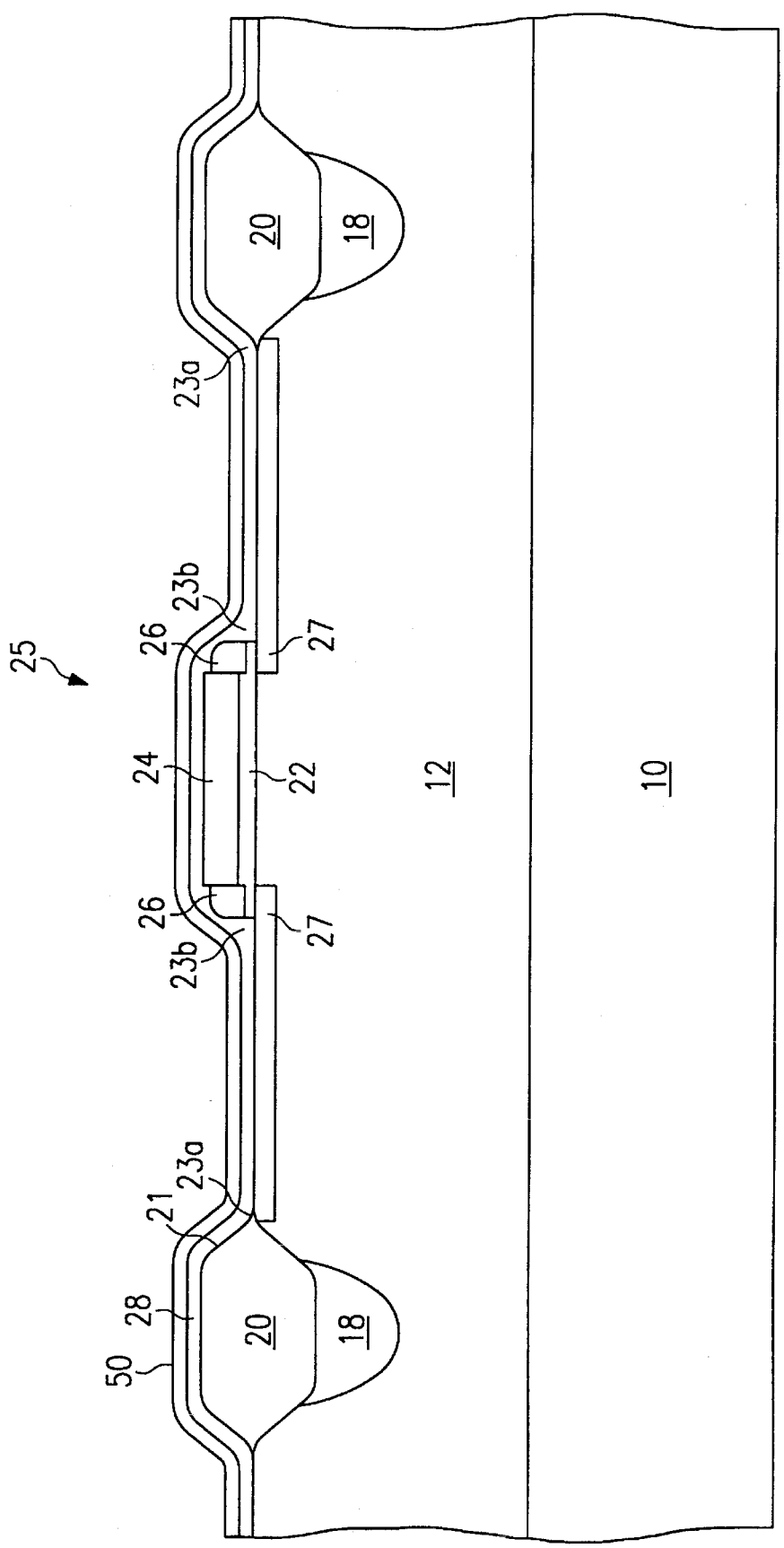
FIGS. 6–9 are cross-sectional elevation views of a field effect transistor at successive stages during fabrication according to a first embodiment of the invention.

The fabrication of a field effect transistor according to a first embodiment of the invention will now be described. Initially, the same steps discussed with respect to FIGS. 1–3 are performed to produce the structure of FIG. 3. A second screen layer 50 is then formed over first screen layer 28, using plasma deposition techniques, for example, to a depth of about 50 nanometers as shown in FIG. 6. The materials used for layers 28 and 50 are selected so that layer 28 is able to act as an etch stop during etching of layer 50. For example, where layer 28 is formed of plasma deposited oxide, nitride, or oxy-nitride, layer 50 may be formed from plasma deposited silicon. Alternatively, where layer 28 is formed of oxide, layer 50 may be formed from nitride or vice versa.

Figure 7:
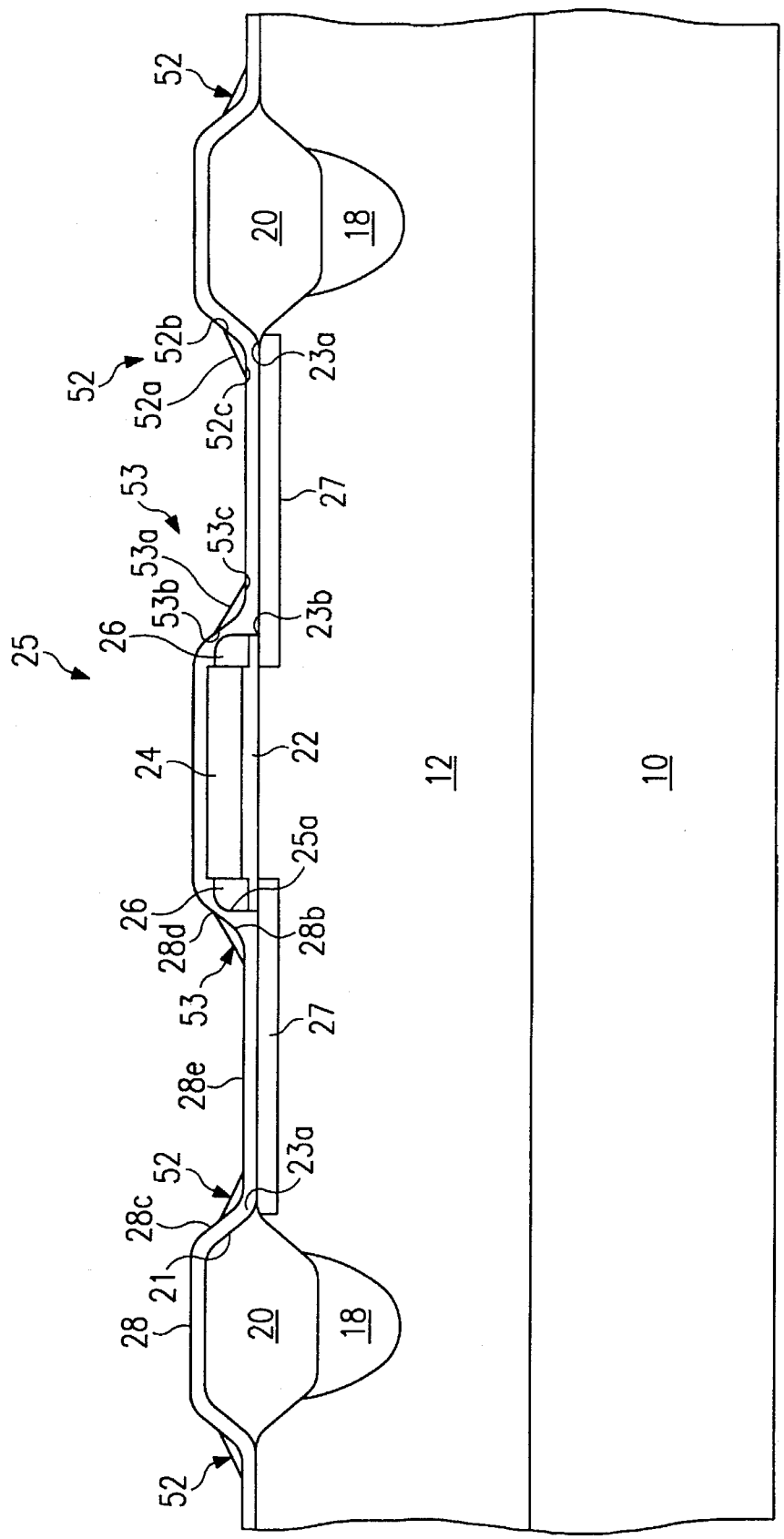

Second screen layer 50 is then anisotropically etched, using HCl and HBr chemistry and endpoint detection for example, to remove the material of layer 50 from the horizontal or flat areas of first screen layer 28 while leaving fillets 52 on layer 28 adjacent corners 23a and fillets 53 on layer 28 adjacent corners 23b, as shown in FIG. 7.

Fillets 52 have a first side or surface 52a, second side or surface 52b, and third side or surface 52c. Surface 52b contacts non-horizontal portion 28c of first screen layer 28 and is adjacent non-horizontal side surface 21 of field oxide region 20. Surface 52c contacts horizontal portion 28e of first screen layer 28 and is adjacent face 13 of epitaxial layer 12. Surface 52a slopes toward face 13 from an edge of surface 52b to an edge of surface 52c.

Fillets 53 have a first side or surface 53a, second side or surface 53b, and third side or surface 53c. Surface 53b contacts non-horizontal portion 28d of first screen layer 28 and is adjacent non-horizontal surface 25a of gate structure 25. Surface 53c contacts horizontal portion 28e of first screen layer 28 and is adjacent face 13 of epitaxial layer 12. Surface 53a slopes toward face 13 from an edge of surface 53b to an edge of surface 53c.

As a result, the combined thickness of screen layer 28 and fillets 52 is greatest adjacent field oxide regions 20 and gradually decreases as the distance from field oxide regions 20 increases. Likewise, the combined thickness of screen layer 28 and fillets 53 is greatest adjacent sidewall spacers 26 of gate structure 25 and gradually decreases as the distance from gate structure 25 increases.

Figure 8:
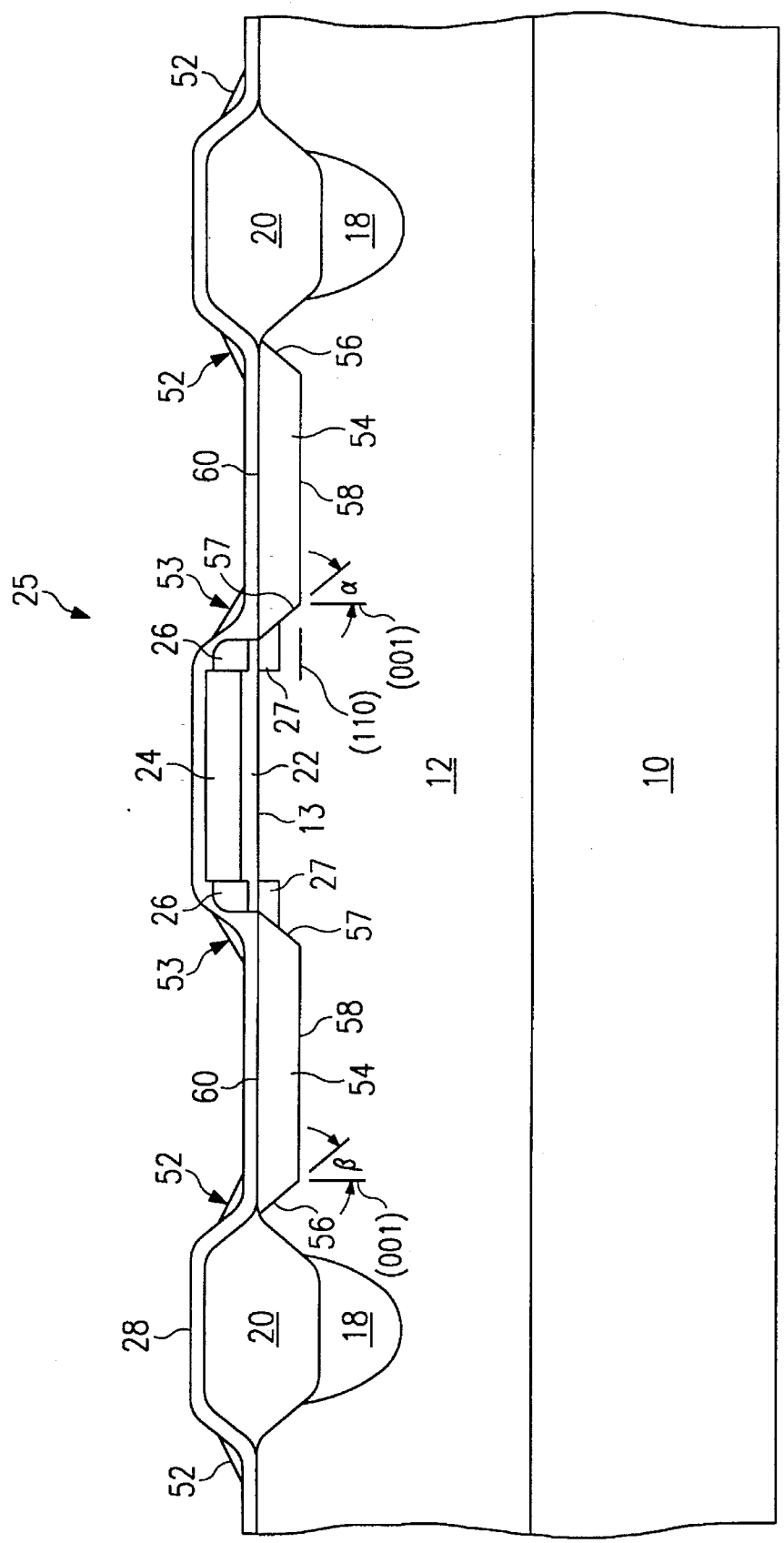

A source/drain implant of a donor impurity, such as arsenic, phosphorous, or antimony, is then performed to create implanted n+ source/drain regions 54 as shown in FIG. 8. Source/drain regions 54 have a top edge 60 at the face 13 of epitaxial layer 12, a bottom edge 58, and side edges 56 and 57 extending from opposite ends of top edge 60 to corresponding ends of bottom edge 58. Implant energy is selected such that where the combined thickness of screen layer 28 and fillets 52 and 53 is greatest (ie. adjacent field oxide regions 20 and sidewall spacers 26) the donor impurities are nearly completely absorbed in fillets 52 and 53 and screen layer 28.

As the combined thickness of screen layer 28 and fillets 52 and 53 decreases, donor impurities are able to penetrate farther into epitaxial layer 12 resulting in source/drain regions 54 having side edges 56 and 57 that slope toward each other as they extend deeper into epitaxial layer 12. Maximum penetration of donor impurities into epitaxial layer 12 is achieved where only screen layer 28 exists over epitaxial layer 12 to define bottom edges 58 of source/drain regions 54. As a result, source/drain regions 54 have top edge 60 at the surface of epitaxial layer 12 with a length that is greater than the length of bottom edge 58. Source/drain regions 54 thus have a tapered profile resulting from their inverted trapezoidal shape. Side edges 56 and 57 are preferably at angles β and α, respectively, that are in the range of from about 3–10 degrees from the (001) plane which is perpendicular to the plane of face 13. Angles β and α may differ slightly due to the fact that side surface 21 of field oxide region 20 is less vertical than side surface 25a of gate structure 25. An exemplary arsenic dose and implant energy which will achieve the desired tapered profile of source/drain region 54 are 1E15 atoms/cm$^3$ and 80 keV.

The source/drain implantation heavily damages the silicon in source/drain regions 54 and in many cases causes the silicon to be amorphized. While bottom edge 58 of source/drain region 54 lies along a (110) plane, side edges 56 and 57 are not aligned with a (001) plane. As a result, when the anneal is performed, recrystallization proceeds primarily from the (110) plane alone rather than from the (110) and (001) planes simultaneously as was the case with the prior art method as discussed with respect to FIG. 4. Accordingly, the edge recrystalline damage caused by the intersecting of recrystallized silicon growing along the (110) and (001) planes simultaneously is avoided.

After source/drain anneal, screen layer 28 and fillets 52 and 53 may remain intact to become part of the final device structure or may be removed by an etch prior to further processing.

Figure 9:
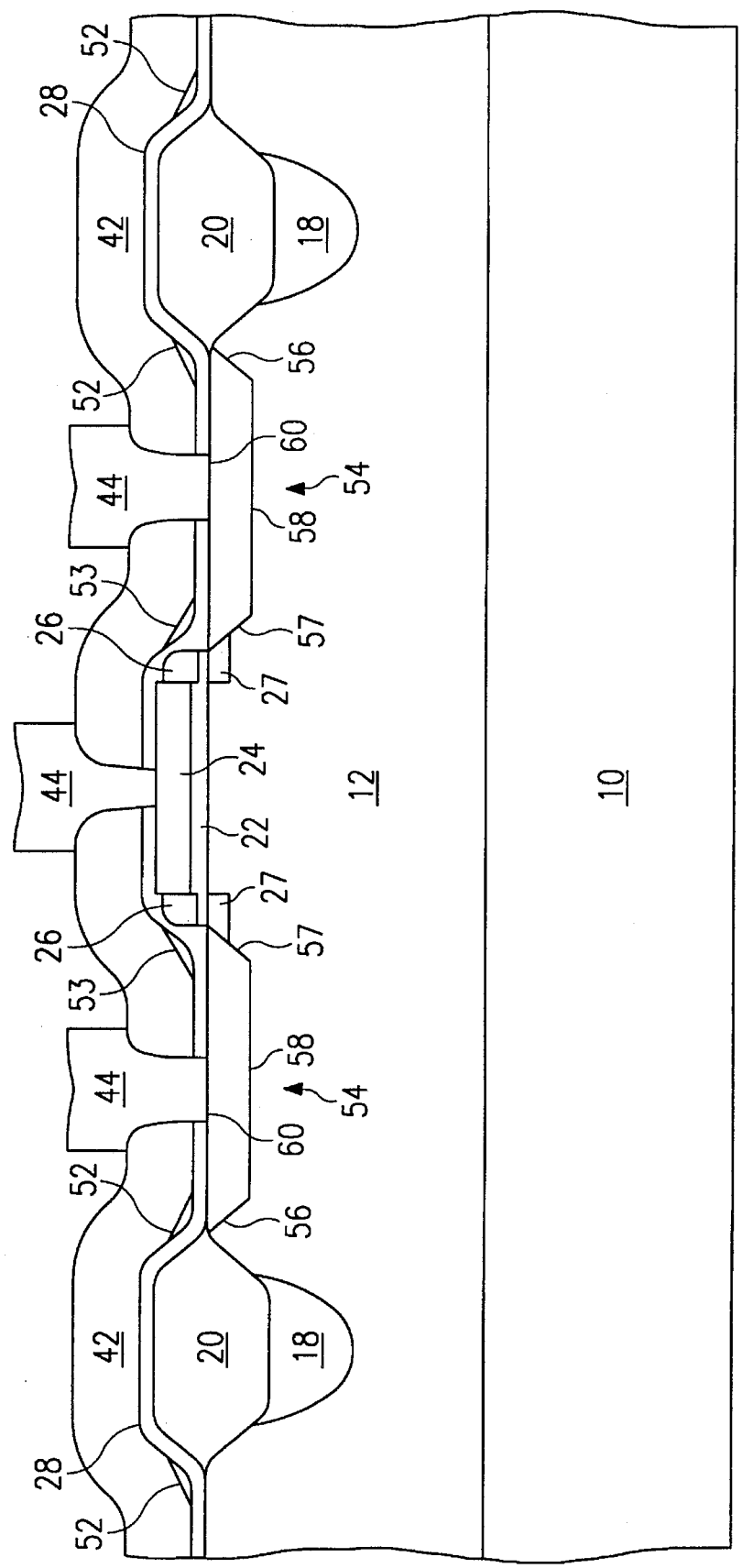

FIG. 9 illustrates a field effect transistor in which screen layer 28 and filaments 52 and 53 are left intact. Following source/drain anneal, a poly-metal dielectric deposition (PMD) layer 42 is then deposited over epitaxial layer 12. Contact openings are then etched in PMD layer 42 to expose top edge 60 of source/drain regions 54 and the top surface of gate 24. A metal layer is then deposited over PMD layer 42 and patterned and etched to form contacts 44 contacting top edges 60 of source/drain regions 54 and the top surface of gate 24.

Figure 10:
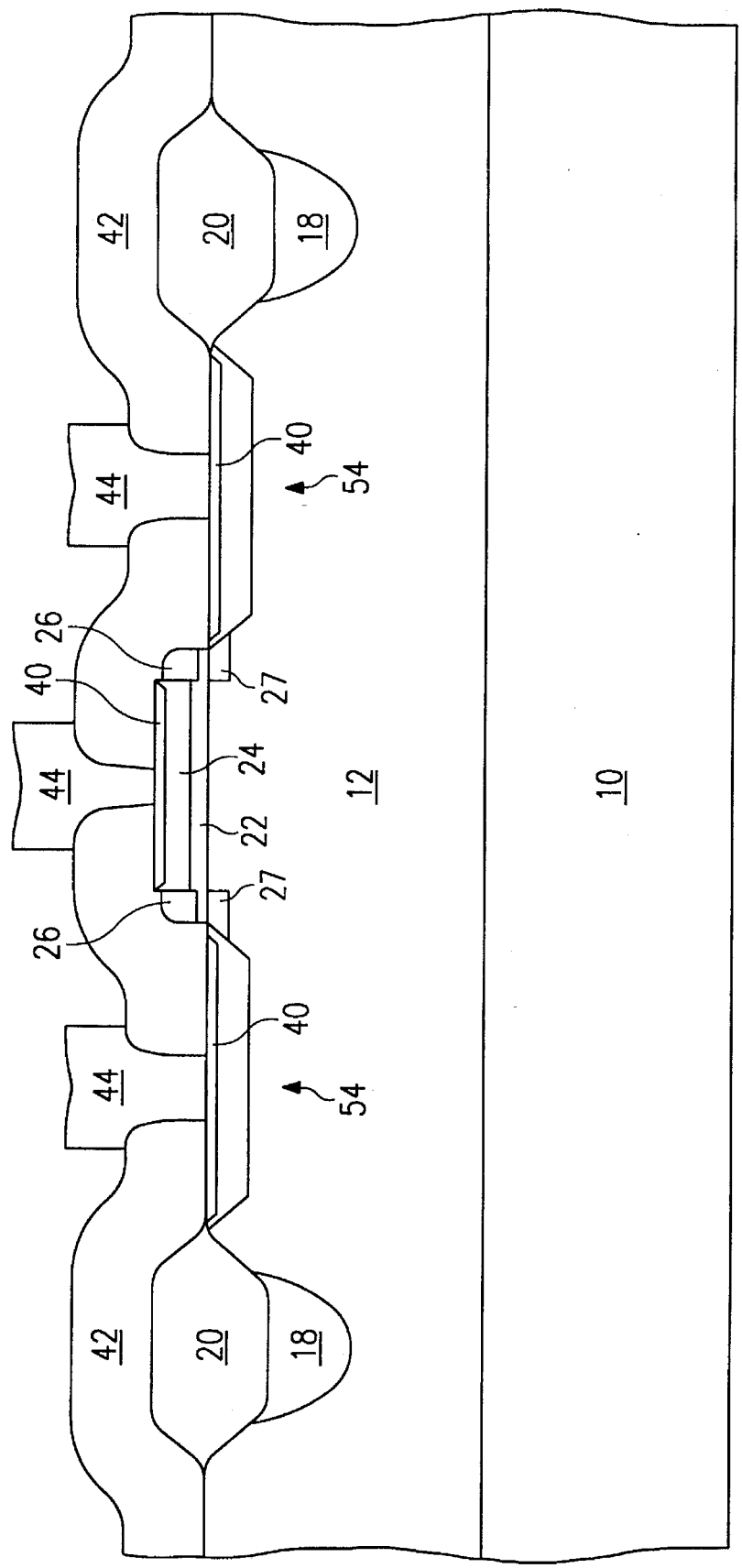
FIG. 10 is a cross-sectional elevation view of a field effect transistor according to a second embodiment of the invention.

FIG. 10 illustrates a field effect transistor according to a second embodiment of the invention in which screen layer 28 and fillets 52 and 53 are removed by an etch following source/drain anneal. After removal of screen layer 28 and fillets 52 and 53, silicide layers 40 are formed by depositing a thin film of material such as Ti or Co, over the surface of epitaxial layer 12 and reacting that material to form silicide layers 40 over source/drain regions 54 and gate 24. A poly-metal dielectric deposition (PMD) layer 42 is then deposited over epitaxial layer 12. Contact openings are then etched in PMD layer 42 to expose portions of silicide layers 40. A metal layer is then deposited over PMD layer 42 and patterned and etched to form contacts 44 contacting silicide layers 40.

Figure 11:
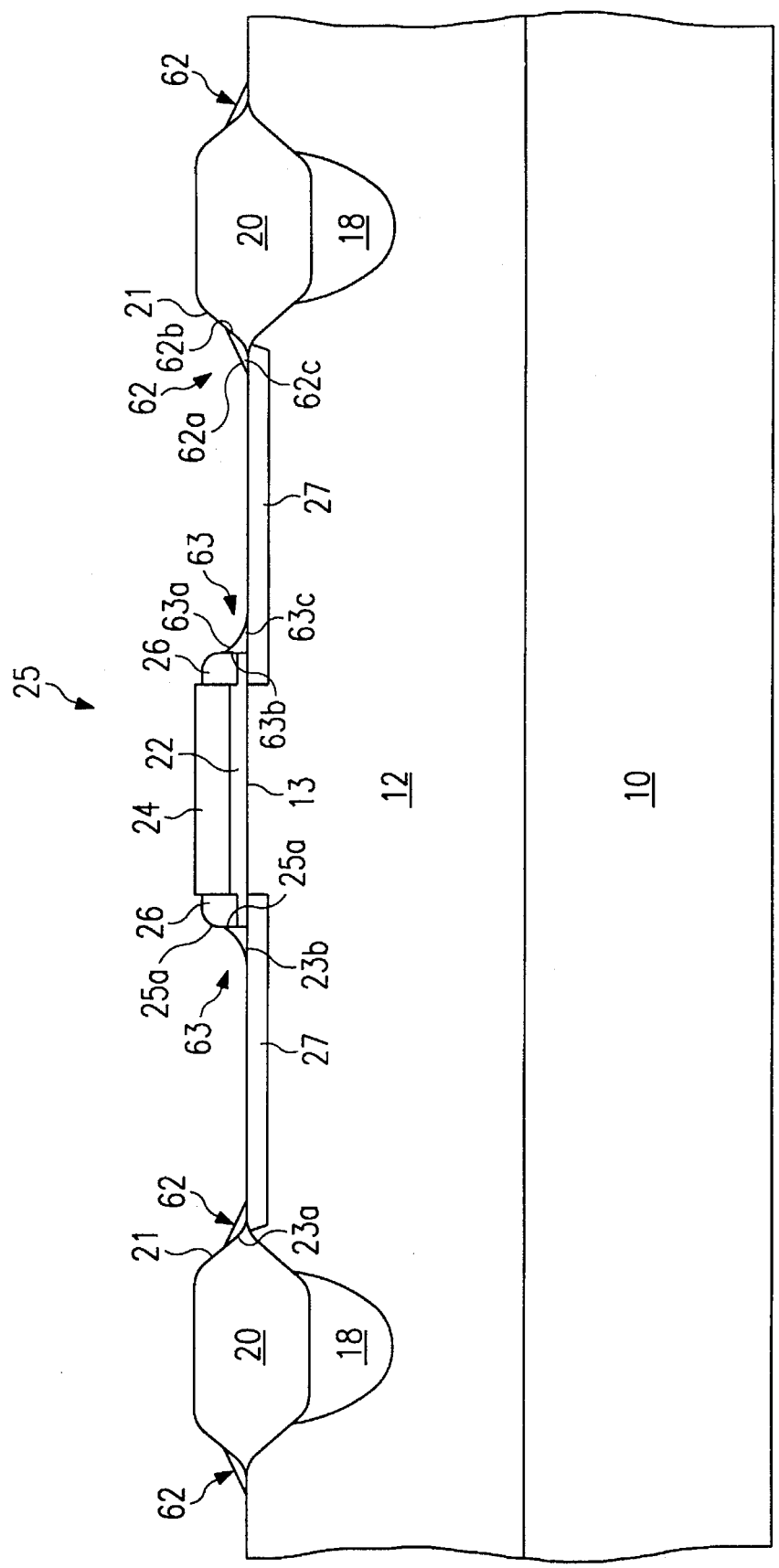
FIGS. 11–12 are cross-sectional elevation views of a field effect transistor at successive stages during fabrication according to a third embodiment of the invention.
Figure 12:
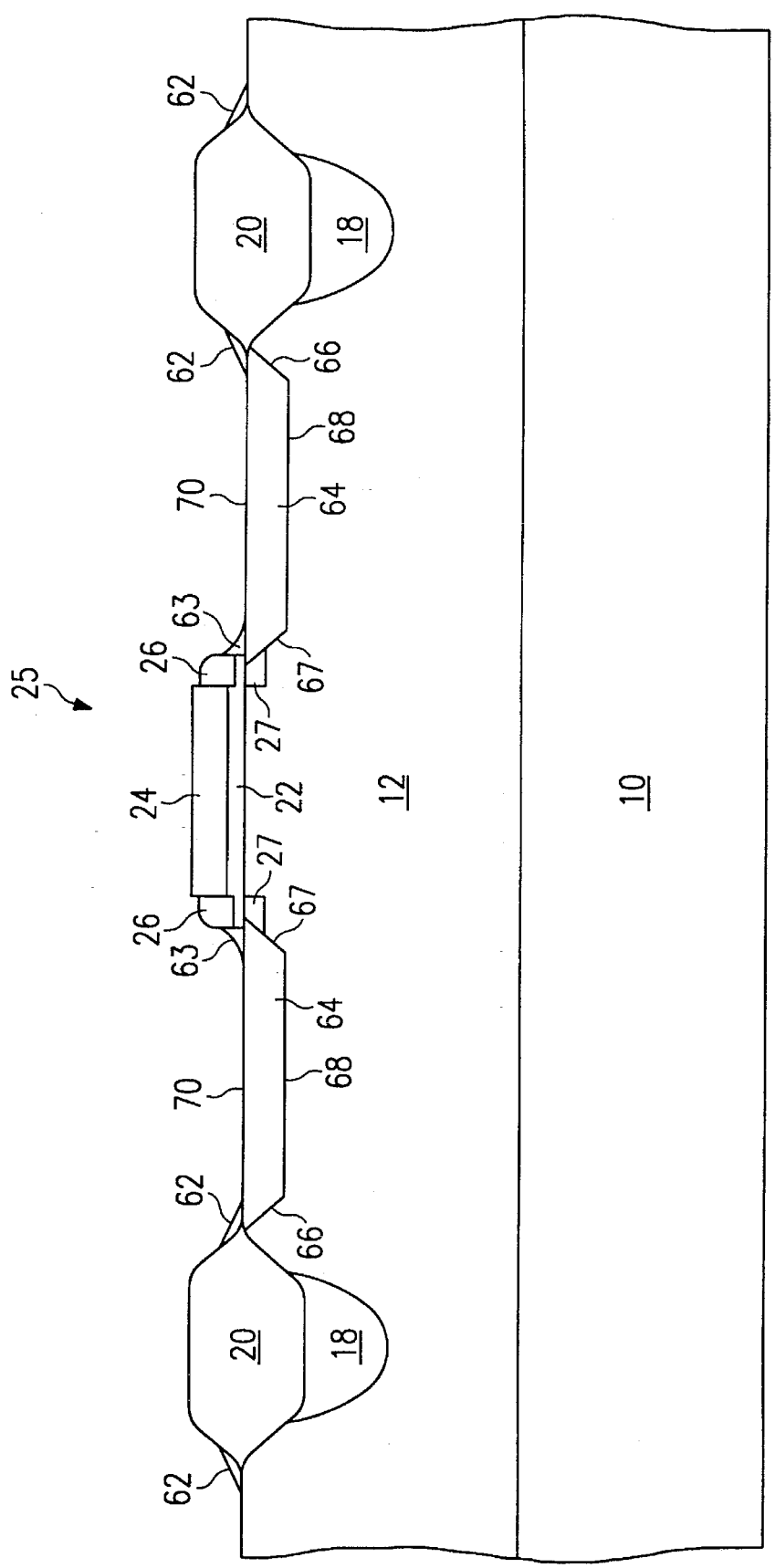

FIGS. 11–12 illustrate successive stages of fabrication of a field effect transistor according to a third embodiment of the invention. Initially, the same steps discussed with respect to FIGS. 1–3 are performed to produce the structure of FIG. 3. Layer 28 is then anisotropically etched to remove the material of layer 28 from the horizontal or flat areas of field oxide regions 20 and face 13 of epitaxial layer 12 while leaving fillets 62 over corners 23a adjacent field oxide regions 20 and fillets 63 over the corners 23b adjacent sidewall spacers 26 as shown in FIG. 11. Fillets 62 slope downward from non-horizontal side edges 21 of field oxide regions 20 toward the horizontal face 13 of epitaxial layer 12. Fillets 63 slope downward from non-horizontal surface 25a of gate structure 25 toward the horizontal face 13 of epitaxial layer 12.

Fillets 62a have a first surface 62a, second surface 62b, and third surface 62c. Surface 62b contacts non-horizontal side surface 21 of field oxide region 20. Surface 62c contacts face 13 of epitaxial layer 12. Surface 62a slopes toward face 13 from an edge of surface 62b to an edge of surface 62c.

Fillets 63 have a first surface 63a, second surface 63b, and third surface 63c. Surface 63b contacts non-horizontal surface 25a of gate structure 25. Surface 63c contacts face 13 of epitaxial layer 12. Surface 63a slopes toward face 13 from an edge of surface 63b to an edge of surface 63c.

As a result, the thickness of fillets 62 is greatest adjacent field oxide regions 20 and gradually decreases as the distance from field oxide regions 20 increases. Likewise, the thickness fillets 63 is greatest adjacent sidewall spacers 26 of gate structure 25 and gradually decreases as the distance from gate structure 25 increases.

A source/drain implant of a donor impurity, such as arsenic, phosphorous, or antimony, is then performed to create implanted source/drain regions 64 as shown in FIG. 12. Implant energy is selected such that where the distance through fillets 62 and 63 to epitaxial layer 12 is greatest (ie. adjacent field oxide regions 20 and sidewall spacers 26) the donor impurities are nearly completely absorbed in fillets 62 and 63. As the distance through fillets 62 and 63 to epitaxial layer 12 decreases, donor impurities are able to penetrate farther into epitaxial layer 12 resulting in source/drain regions 64 having side edges 66 and 67 that slope toward each other. Maximum penetration of donor impurities into epitaxial layer 12 is achieved where the fillets 62 are not present over epitaxial layer 12 to define bottom edges 68 of source/drain regions 64. As a result, source/drain regions 64 have top edge 70 at the surface of epitaxial layer 12 with a length that is greater than the length of bottom edge 68. Side edges 66 and 67 are preferably at angles that are in the range of from about 3–10 degrees from the (001) plane which is perpendicular to the plane of face 13.

The source/drain implantation heavily damages the silicon in source/drain regions 64 and in many cases causes the silicon to be amorphized. While bottom edge 68 of source/drain region 64 lies along a (110) plane, side edges 66 and 67 are not aligned with a (001) plane. As a result, when the anneal is performed, recrystallization proceeds primarily from the (110) plane alone rather than from the (110) and (001) planes simultaneously as was the case with the prior art method as discussed with respect to FIG. 4. Accordingly, the edge recrystalline damage caused by the intersecting of recrystallized silicon growing along the (110) and (001) planes simultaneously is avoided.

After source/drain anneal, fillets 62 and 63 may remain intact to become part of the final device structure or may be removed by an etch prior to further processing. Contacts may be formed using either the method described with respect to FIG. 9 or the method described with respect to FIG. 10.

Figure 13:
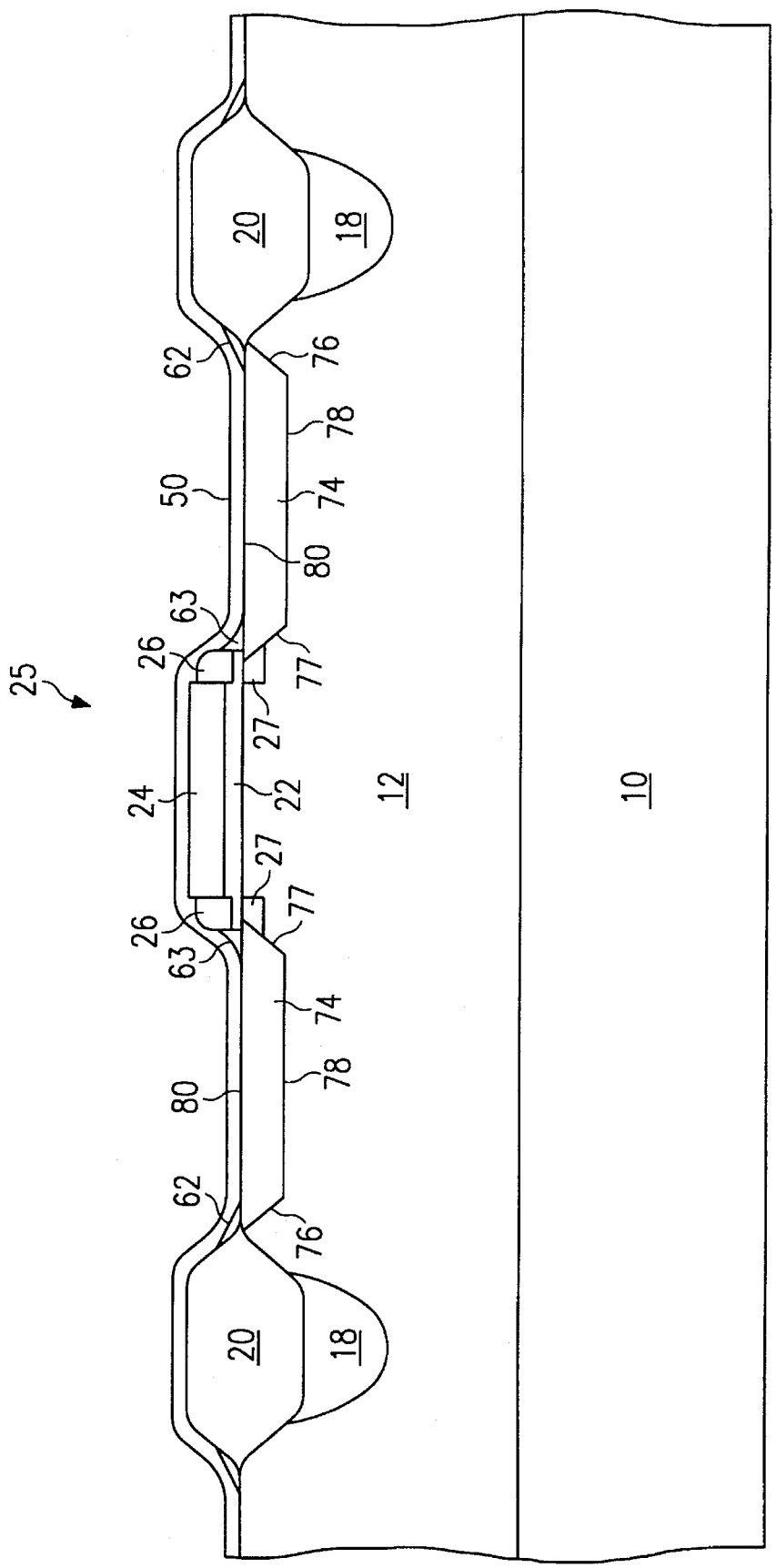
FIG. 13 is a cross-sectional elevation view of a field effect transistor according to a fourth embodiment of the invention.

FIG. 13 illustrates a field effect transistor according to a fourth embodiment of the invention. The fabrication of the transistor of FIG. 13 is identical to that of FIG. 12 with the exception that second screen layer 50 is formed over the surface of the transistor prior to source/drain implant.

Source/drain implants of a donor impurity, such as arsenic, phosphorous, or antimony, are then performed to create implanted source/drain regions 74 as shown in FIG. 13. Implant energy is selected such that where the distance through fillets 62 and 63 and layer 50 to epitaxial layer 12 is greatest (ie. adjacent field oxide regions 20 and sidewall spacers 26) the donor impurities are nearly completely absorbed in fillets 62 and 63 and layer 50. As the distance through fillets 62 and 63 and layer 50 to epitaxial layer 12 decreases, donor impurities are able to penetrate farther into epitaxial layer 12 resulting in source/drain regions 74 having side edges 76 and 77 that slope toward each other. Maximum penetration of donor impurities into epitaxial layer 12 is achieved where only fillets 62 and 63 are not present over epitaxial layer 12 to define bottom edges 78 of source/drain regions 74. As a result, source/drain regions 74 have top edge 80 at the surface of epitaxial layer 12 with a length that is greater than the length of bottom edge 78. Side edges 76 and 77 are preferably at angles that are in the range of from about 3–10 degrees from the (001) plane which is perpendicular to the plane of face 13. As a result, edge recrystalline damage caused by the intersecting of recrystallized silicon growing along the (110) and (001) planes simultaneously is avoided as discussed above.

After source/drain anneal, fillets 62 and 63 and layer 50 may remain intact to become part of the final device structure or may be removed by an etch prior to further processing. Contacts may be formed using either the method described with respect to FIG. 9 or the method described with respect to FIG. 10.

Figure 14:
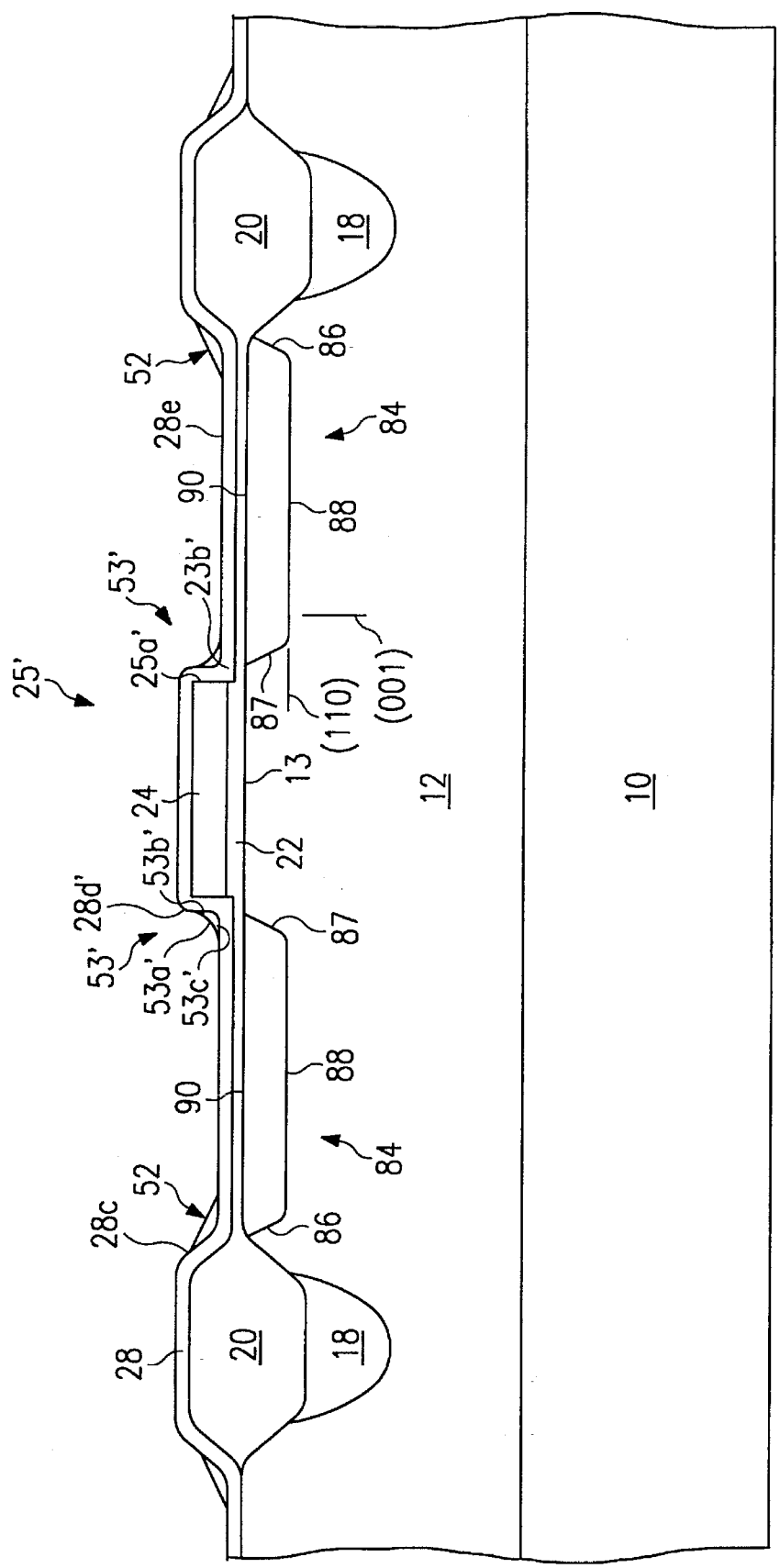
FIG. 14 is a cross-sectional elevation view of a field effect transistor according to a fifth embodiment of the invention.

FIG. 14 illustrates a field effect transistor according to a fifth embodiment of the invention. The fabrication of the transistor of FIG. 14 is identical to that of FIG. 7 with the exception that gate structure 25' is formed without sidewall spacers 26. Gate structure 25' includes gate 24 and gate oxide layer 22 and is formed by patterning and etching the polysilicon layer to define gate 24 and partially etching exposed portions of gate oxide layer 22. Gate structure 25' has side surfaces 25a' that extend upwardly from face 13 of epitaxial layer 12 to define corners 23b' adjacent face 13. Corners 23b' are located at the interface of side surfaces 25a' of gate structure 25' and gate oxide layer 22.

First screen layer 28 is then formed over epitaxial layer 12. Second screen layer 50 is formed over layer 28 and anisotropically etched to form fillets 52 and 53'. Fillets 52 and 53' slope downward from the non-horizontal portions 28c and 28d' of layer 28 toward the horizontal portions 28e of layer 28. Fillets 53' have a first surface 53a', second surface 53b', and third surface 53c'. Surface 53b' contacts non-horizontal portion 28d' of first screen layer 28 and is adjacent non-horizontal surface 25a' of gate structure 25'. Surface 53c' contacts horizontal portion 28e of first screen layer 28 and is adjacent face 13 of epitaxial layer 12. Surface 53a' slopes toward face 13 from an edge of surface 53b' to an edge of surface 53c'.

As a result, the combined thickness of screen layer 28 and fillets 52 and 53' is greatest adjacent field oxide regions 20 and side surface 25a' of gate structure 25' and gradually decreases as the distance from field oxide regions 20 and side surface 25a' increases.

A source/drain implant of a donor impurity, such as arsenic, phosphorous, or antimony, is then performed to create implanted source/drain regions 84 as shown in FIG. 14. Implant energy is selected such that where the combined thickness of screen layer 28 and fillets 52 and 53' is greatest (ie. adjacent field oxide regions 20 and side surface 25a') the donor impurities are nearly completely absorbed in fillets 52 and 53' and screen layer 28. As the combined thickness of screen layer 28 and fillets 52 and 53' decreases, donor impurities are able to penetrate farther into epitaxial layer 12 resulting in source/drain regions 84 having side edges 86 and 87 that slope toward each other. Maximum penetration of donor impurities into epitaxial layer 12 is achieved where only screen layer 28 exists over epitaxial layer 12 to define bottom edges 88 of source/drain regions 84. As a result, source/drain regions 84 have top edges 90 at the surface of epitaxial layer 12 with a length that is greater than the length of bottom edge 88. Side edges 86 and 87 are preferably at angles that are in the range of from about 3–10 degrees from the (001) plane which is perpendicular to the plane of face 13.

As a result, edge recrystalline damage caused by the intersecting of recrystallized silicon growing along the (110) and (001) planes simultaneously is avoided as discussed above. After source/drain anneal and drive-in (which causes top edge 90 to diffuse beneath gate 24), fillets 52 and 53' and layer 50 may remain intact to become part of the final device structure or may be removed by an etch prior to further processing. Contacts may be formed using either the method described with respect to FIG. 9 or the method described with respect to FIG. 10. Although not shown, it is understood that fillets 52 and 53' in FIG. 14 could be replaced with fillets that contact face 13 as described above with respect to FIGS. 11–13.

Figure 15:
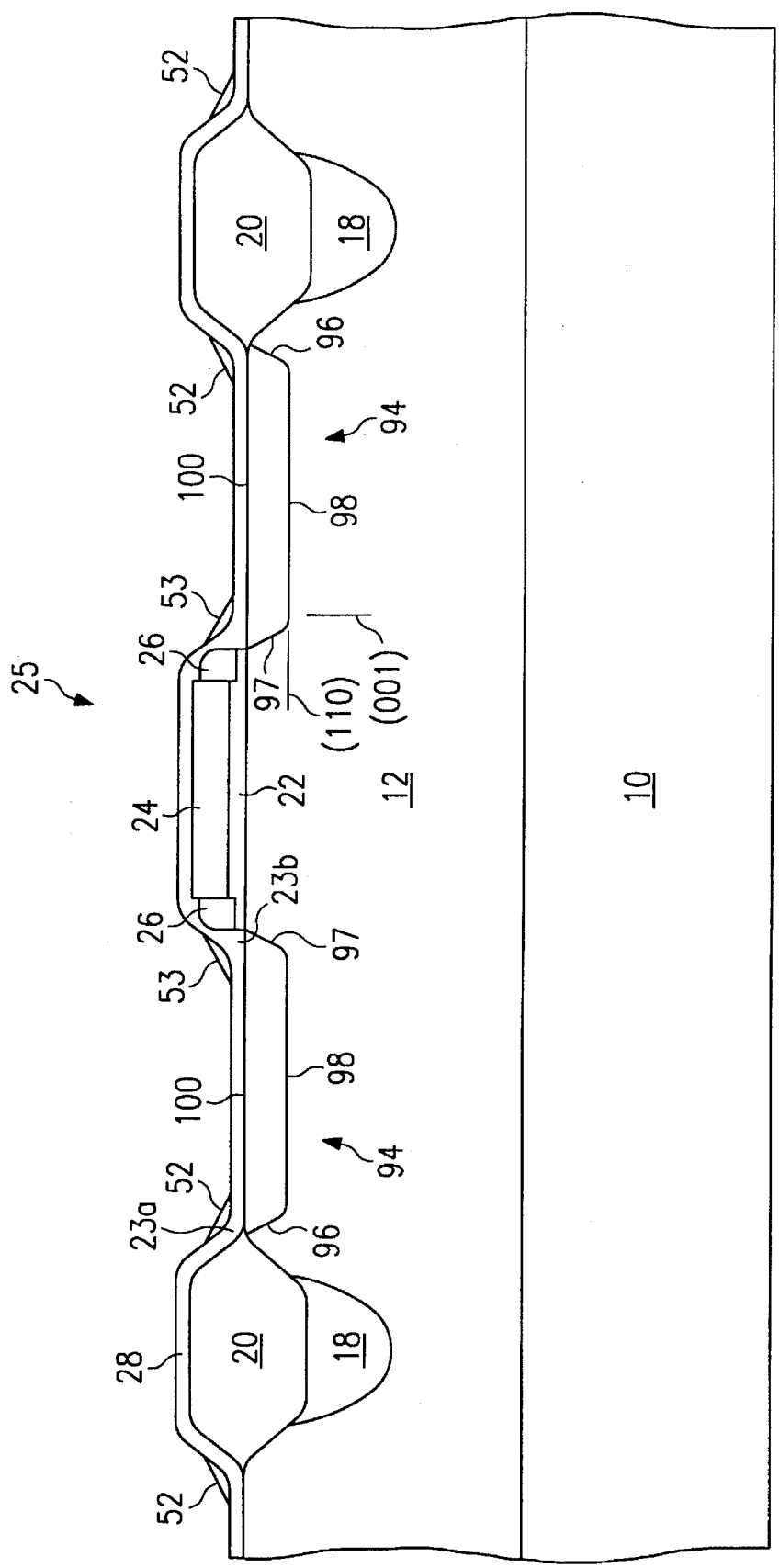
FIG. 15 is a cross-sectional elevation view of a field effect transistor according to a sixth embodiment of the invention.

FIG. 15 illustrates a field effect transistor according to a sixth embodiment of the invention. The transistor of FIG. 15 is fabricated by initially performing the same steps discussed with respect to FIG. 1 to produce the structure of FIG. 1. Oxide layer 14 and nitride layer 16 are then removed by etching to expose the face of epitaxial layer 12. A gate oxide layer 22 is then thermally grown over the face of epitaxial layer 12 between field oxide regions 10 to a thickness of about 6–40 nanometers. A layer of polysilicon having a thickness of 100–500 nanometers is then deposited over epitaxial layer 12 and doped with an impurity to render it conductive. The layer of polysilicon is then patterned with photoresist and etched to define conductive gate 24.

An insulator layer, of oxide or nitride, for example, is then deposited over epitaxial layer 12 and anisotropically etched to form sidewall spacers 26. This etch also removes a portion of gate oxide layer 22 to expose the face of epitaxial layer 12 between field oxide regions 20 and sidewall spacers 26. This results in gate structure 25 that includes gate 24, gate oxide layer 22, and sidewall spacers 26 as seen in FIG. 15.

A screen layer 28 formed of oxide, nitride, or oxy-nitride, for example, and having a thickness of about 20–40 nanometers is then deposited or grown over epitaxial layer 12. A second screen layer 50 is then formed over first screen layer 28, using plasma deposition techniques, for example, to a depth of about 50 nanometers. The second screen layer is then anisotropically etched leaving fillets 52 on layer 28 adjacent corners 23a and fillets 53 on layer 28 adjacent corners 23b.

A source/drain implant of a donor impurity, such as arsenic, phosphorous, or antimony, is then performed to create implanted n+ source/drain regions 94. Implant energy is selected such that where the combined thickness of screen layer 28 and fillets 52 and 53 is greatest (ie. adjacent field oxide regions 20 and sidewall spacers 26) the donor impurities are nearly completely absorbed in fillets 52 and 53 and screen layer 28. As the combined thickness of screen layer 28 and fillets 52 and 53 decreases, donor impurities are able to penetrate farther into epitaxial layer 12 resulting in source/drain regions 94 having side edges 96 and 97 that slope toward each other. Maximum penetration of donor impurities into epitaxial layer 12 is achieved where only screen layer 28 exists over epitaxial layer 12 to define bottom edges 98 of source/drain regions 94. As a result, source/drain regions 94 have top edge 100 at the surface of epitaxial layer 12 with a length that is greater than the length of bottom edge 98. Side edges 96 and 97 are preferably at angles that are in the range of from about 3–10 degrees from the (001) plane which is perpendicular to the plane of face 13.

As a result, edge recrystalline damage caused by the intersecting of recrystallized silicon growing along the (110) and (001) planes simultaneously is avoided as discussed above. After source/drain anneal and drive-in (which causes top edge 100 to diffuse beneath gate 24), fillets 52 and 53 and layer 50 may remain intact to become part of the final device structure or may be removed by an etch prior to further processing. Contacts may be formed using either the method described with respect to FIG. 9 or the method described with respect to FIG. 10. Although not shown, it is understood that fillets 52 and 53 in FIG. 14 could be replaced with fillets that contact face 13 as described above with respect to FIGS. 11–13.

An advantage of the invention is the reduction of residual recrystallization damage during anneal of implanted silicon and, as a result, a reduction in dislocation density. The reduction in dislocation density translates into an increase in manufacturing yield and an increase in reliability.

A few preferred embodiments have been described in detail hereinabove. It is to be understood that the scope of the invention also comprehends embodiments different from those described, yet within the scope of the claims.

For example, the method can be used to fabricate an FET directly in the face of a substrate instead of in the face of an epitaxial layer or when fabricating an FET of the opposite conductivity type as in the case of a p-channel transistor of a CMOS integrated circuit. In addition, although described in terms of FET manufacture, the process of the invention can be applied to any process that forms self-aligned implanted regions in a semiconductor layer. The process is also applicable to semiconductor materials other than silicon, such as gallium arsenide, in which an implanted region is damaged by the implant.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for forming an implanted region in a semiconductor layer, comprising the steps of:

forming a surface extending upwardly from a face of said semiconductor layer to define a corner adjacent said face;

forming an insulating layer over said face and said surface extending upwardly from said face;

forming a fillet over said insulating layer adjacent said corner, said fillet having a first surface adjacent said face, a second surface adjacent said surface extending upwardly from said face, and a third surface extending from an edge of said second surface to an edge of said first surface; and implanting an impurity through said fillet into said semiconductor layer to form an implanted region having a side edge and a bottom edge, said side edge sloped at an angle with respect to a plane perpendicular to said face, said bottom edge parallel to said face.

2. The method of claim 1 in which said step of forming a surface extending upwardly from said face includes growing a field oxide region.

3. The method of claim 1 in which said step of forming a surface extending upwardly from said face includes forming a gate structure over said face.

4. The method of claim 3 in which said step of forming a gate structure includes forming a conductive gate over said face.

5. The method of claim 3 in which said step of forming a gate structure includes the steps of:

forming a conductive gate over said face; and forming sidewall spacers on sidewalls of said conductive gate.

6. The method of claim 1 in which said step of forming a fillet includes the steps of:

forming a layer of material over said face and said surface extending upwardly from said face; and anisotropically etching said layer of material.

7. The method of claim 1 in which said semiconductor layer is an epitaxial layer formed on a silicon substrate.

8. The method of claim 1 in which said semiconductor layer is of a first conductivity type and said implanted region is of a second conductivity type opposite said first conductivity type.

9. The method of claim 1 in which said plane is a (001) plane.

10. The method of claim 9 in which said side edge is sloped at an angle in the range of 3–10 degrees with respect to said (001) plane.

11. A method for forming an implanted region in a semiconductor layer, comprising the steps of:

forming a first surface extending upwardly from a face of said semiconductor layer to define a first corner adjacent said face;

forming a second surface extending upwardly from a face of said semiconductor layer to define a second corner adjacent said face;

forming an insulating layer over said face and said first and second surfaces extending upwardly from said face;

forming a first fillet over said insulating layer adjacent said first corner and a second fillet adjacent said second corner, said first fillet having a first side adjacent said face, a second side adjacent said first surface extending upwardly from said face, and a third side extending from an edge of said second side to an edge of said first side, said second fillet having a first side adjacent said face, a second side adjacent said second surface extending upwardly from said face, and a third side extending from an edge of said second side of said second fillet to an edge of said first side of said second fillet; and implanting an impurity into said semiconductor layer to form an implanted region having a top edge, a bottom edge and first and second side edges, said impurity being implanted through said first fillet and second fillet to form a first and second side edges of said implanted region, said first and second side edges sloping toward each other so that said top edge has a length greater than a length of said bottom edge.

12. The method of claim 11 in which said step of forming a first surface extending upwardly from said face includes growing a field oxide region.

13. The method of claim 11 in which said step of forming a second surface extending upwardly from said face includes forming a gate structure over said face.

14. The method of claim 11 in which said step of forming first and second fillets includes the steps of:

forming a layer of material over said face and said first and second surfaces extending upwardly from said face; and anisotropically etching said layer of material.

15. The method of claim 11 in which said first and second side edges are sloped at angles in the range of 3–10 degrees with respect to a (001) plane.

\* \* \* \* \*